(12) United States Patent
Iga et al.

(10) Patent No.: US 12,713,858 B2
(45) Date of Patent: Aug. 18, 2026

(54) WAFER PROCESSING METHOD

(71) Applicant: DISCO CORPORATION, Tokyo (JP)

(72) Inventors: Hayato Iga, Tokyo (JP); Kazuya Hirata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 349 days.

(21) Appl. No.: 18/486,670

(22) Filed: Oct. 13, 2023

(65) Prior Publication Data

US 2024/0128087 A1 Apr. 18, 2024

(30) Foreign Application Priority Data

Oct. 14, 2022 (JP) ................................ 2022-165606

(51) Int. Cl.

*H10P 52/00* (2026.01)
*H10P 72/00* (2026.01)
*H10P 72/70* (2026.01)
*H10P 90/00* (2026.01)

(52) U.S. Cl.

CPC .......... *H10P 52/00* (2026.01); *H10P 72/0428* (2026.01); *H10P 72/74* (2026.01); *H10P 90/128* (2026.01); *H10P 72/7416* (2026.01)

(58) Field of Classification Search

CPC ............. H01L 21/304; H01L 21/02021; H01L 21/67092; H01L 21/6835; H01L 2221/68327; H10P 52/00; H10P 72/0428; H10P 72/74; H10P 72/7416; H10P 90/128

USPC ........................................................ 438/463

See application file for complete search history.

(56) References Cited

U.S. PATENT DOCUMENTS

2009/0162994 A1 * 6/2009 Sakamoto ............ B28D 5/0011 219/121.72
2020/0051862 A1 * 2/2020 Piao ...................... H01L 21/304

FOREIGN PATENT DOCUMENTS

JP 2007158239 A 6/2007
JP 2020057709 A 4/2020
JP 2020088187 A 6/2020
WO WO-0045421 A2 * 8/2000 ......... H01L 21/6715

(Continued)

OTHER PUBLICATIONS

Wen, CN 114188265, Semiconductor Processing Device, Semiconductor Processing System and Semiconductor Edge Processing Method, Published Mar. 15, 2022 (Year: 2022).*

(Continued)

*Primary Examiner* — Tu-Tu V Ho

(74) *Attorney, Agent, or Firm* — Greer Burns & Crain Ltd.

(57) ABSTRACT

A wafer processing method includes bonding one surface of a first wafer to a second wafer, the first wafer having a device region on the one surface, a peripheral surplus region, and a chamfered peripheral edge; forming an annular modified layer along a boundary of the device region and the peripheral surplus region by applying a laser beam to the first wafer from the other surface of the first wafer with a focal point of the laser beam placed at the boundary; after forming the modified layer, grinding the first wafer from the other surface to thin the first wafer to a finished thickness; and exerting an external force on the peripheral surplus region that is close to the peripheral edge with respect to a region in which the modified layer is formed, to thereby facilitate the separation of the peripheral surplus region.

6 Claims, 6 Drawing Sheets

(56) References Cited

FOREIGN PATENT DOCUMENTS

WO 2022014107 A 1/2022

OTHER PUBLICATIONS

Lee, JP 2022165203, Laminated Wafer Grinding Method, Published Oct. 31, 2022 (Year: 2022).*

Office action issued in corresponding Japanese patent application No. 2022-165606, dated Jun. 17, 2026.

* cited by examiner

WAFER PROCESSING METHOD

BACKGROUND OF THE INVENTION

Field of the Invention

The present invention relates to a wafer processing method.

Description of the Related Art

Attendant on height reduction and higher integration of device chips in recent years, the development of a semiconductor wafer which is laminated in three dimensions has been proceeded. For example, a through-silicon via (TSV) wafer makes it possible to connect electrodes on two chips to each other with through electrodes by bonding the chips to each other.

Such a wafer is ground and thinned in the state of being bonded to a support wafer (silicon, glass, ceramic, or the like) which serves as a base. Normally, a wafer is chamfered at the peripheral edge thereof. Thus, when the wafer is ground to be extremely thin, the peripheral edge becomes what is called a knife edge, and chipping of the edge is liable to occur during grinding. As a result, the chipping may extend to devices, leading to damage to the devices.

As a measure against the knife edge, there has been developed what is called an edge trimming technology of cutting the peripheral edge on the front surface side of the wafer into an annular shape (see Japanese Patent No. 4895594). In addition, there has also been devised an edge trimming method (see Japanese Patent Laid-open No. 2020-057709). In this method, after wafers are bonded together to obtain a bonded wafer, a laser beam is applied thereto along the peripheral edge of a device region to form an annular modified layer therein, which restrains the edge chipping from extending to the devices during grinding of the wafer.

SUMMARY OF THE INVENTION

However, according to the method disclosed in Japanese Patent No. 4895594, there is a possibility that chipping may reach the devices during cutting, damaging the devices. Further, since a large amount of sawdust is generated, there is a problem that the devices are liable to be contaminated by contaminants. In addition, according to the method disclosed in Japanese Patent Laid-open No. 2020-057709, there is a possibility that, in the case where a modified layer is formed in the wafer in an inner region than an adhesion region, an end part of a peripheral surplus region that is to be removed may not be peeled off but remain unremoved upon grinding.

Accordingly, it is an object of the present invention to provide a wafer processing method capable of removing a peripheral surplus region while restraining damage to devices in a step of grinding a bonded wafer.

In accordance with an aspect of the present invention, there is provided a wafer processing method including a bonded wafer forming step of forming a bonded wafer by bonding one surface of a first wafer to one surface of a second wafer, the first wafer having a device region in which a plurality of devices are formed on the one surface, a peripheral surplus region surrounding the device region, and a chamfered peripheral edge, a modified layer forming step of forming an annular modified layer along a boundary of the device region and the peripheral surplus region of the first wafer by applying a laser beam having such a wavelength as to be transmitted through the first wafer to the first wafer from another surface of the first wafer that is opposite to the one surface thereof, with a focal point of the laser beam placed at the boundary, a grinding step of, after the modified layer forming step, grinding the first wafer of the bonded wafer from the other surface of the first wafer to thin the first wafer to a finished thickness, and an external force exerting step of, during or after the grinding step, exerting an external force on the peripheral surplus region that is close to the peripheral edge with respect to a region in which the modified layer is formed in the modified layer forming step, to thereby facilitate separation of the peripheral surplus region.

Preferably, in the modified layer forming step, the laser beam is applied to the first wafer in such a manner that the focal point of the laser beam is sequentially placed at a position closer to the one surface of the first wafer toward the peripheral edge, to thereby form the modified layer in a shape extending along a side surface of a truncated cone inclined from the one surface toward the other surface of the first wafer.

Preferably, in the modified layer forming step, the laser beam is applied to the first wafer in such a manner that cracks extending from the modified layer do not appear on the one surface side of the first wafer, to thereby restrain the peripheral surplus region from being separated from the first wafer while the grinding step is carried out, but separate the peripheral surplus region from the first wafer in the external force exerting step.

Preferably, in the external force exerting step, an ultrasonic wave is applied to the peripheral surplus region to thereby facilitate the separation of the peripheral surplus region. Preferably, in the external force exerting step, at least one of fluid or a solid is blown to the peripheral surplus region to thereby facilitate the separation of the peripheral surplus region.

Preferably, in the external force exerting step, a pressing member capable of moving in a direction perpendicular to the one surface of the first wafer exerts a load on the peripheral surplus region to thereby facilitate the separation of the peripheral surplus region.

According to the invention of the present application, the peripheral surplus region can be removed while damage to devices is restrained in the step of grinding the bonded wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited to the details of the following description. In addition, constituent elements described below include those which can easily be conceived of by a person skilled in the art and those which are substantially the same as those described below. Further, the configurations described below can be combined as required. Besides, various omissions, replacements, or modifications of the configurations can be made in such ranges as not to depart from the gist of the present invention.

A method of processing a wafer 10 (see FIG. 2) according to an embodiment of the present invention will be described on the basis of the drawings. The method of processing the wafer 10 according to the embodiment is a method of bonding a pair of wafers 10 together and grinding one of the wafers 10 (first wafer 10-1) to thin it to a predetermined thickness.

Note that, in the following description, when the pair of wafers 10 are distinguished from each other, one wafer 10 is referred to as the first wafer 10-1, whereas the other wafer 10 is referred to as a second wafer 10-2 (see FIG. 2). When the wafers 10 are not distinguished from each other, on the other hand, they are simply referred to as the wafers 10. In the following description of the embodiment, the other wafer, i.e., the second wafer 10-2, which is not thinned is a TSV wafer similar to the first wafer 10-1, but may be a simple substrate wafer free of a pattern in the present invention.

Figures 1, 2:
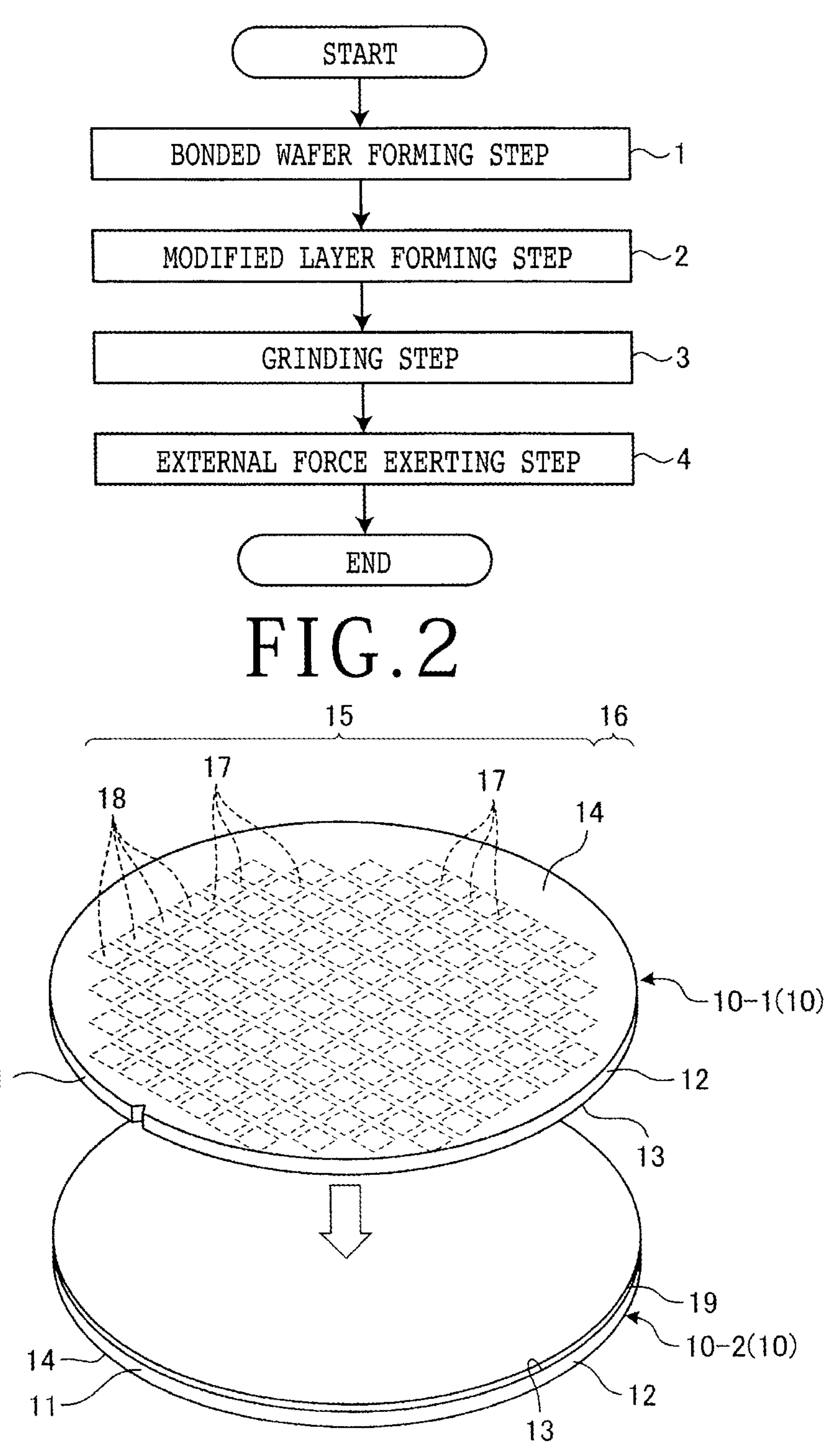
FIG. 1 is a flow chart depicting the flow of a wafer processing method according to an embodiment.
FIG. 2 is a perspective view depicting one state in a bonded wafer forming step depicted in FIG. 1.

FIG. 1 is a flow chart depicting the flow of the method of processing the wafer 10 according to the embodiment. As depicted in FIG. 1, the method of processing the wafer 10 according to the embodiment includes a bonded wafer forming step 1, a modified layer forming step 2, a grinding step 3, and an external force exerting step 4.

Figure 3:
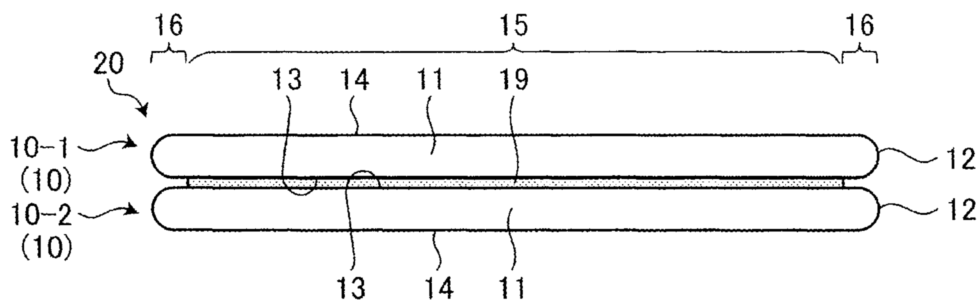
FIG. 3 is a sectional view depicting a bonded wafer that has undergone the bonded wafer forming step depicted in FIG. 1.

FIG. 2 is a perspective view depicting one state in the bonded wafer forming step 1 depicted in FIG. 1. FIG. 3 is a sectional view depicting a bonded wafer 20 that has undergone the bonded wafer forming step 1 depicted in FIG. 1. The bonded wafer forming step 1 is a step of forming the bonded wafer 20 by bonding one surface of the first wafer 10-1 to one surface of the second wafer 10-2.

First, the configurations of the wafers 10 (the first wafer 10-1 and the second wafer 10-2) to be processed will be described. Each of the wafers 10 depicted in FIGS. 2 and 3 is a wafer such as a disk-shaped semiconductor wafer or optical device wafer using silicon (Si), sapphire ($Al_2O_3$), gallium arsenide (GaAs), silicon carbide (SiC), or the like for a substrate 11. In the embodiment, the wafer 10 is a silicon wafer. As depicted in FIG. 3, the wafer 10 is chamfered at a peripheral edge 12 thereof in such a manner that the center in the thickness direction projects furthest to the periphery side and the cross section thereof has a circular arc shape from a front surface 13 to a back surface 14 of the substrate 11.

As depicted in FIG. 2, the wafer 10 includes a device region 15 and a peripheral surplus region 16 surrounding the device region 15. The device region 15 has a plurality of division lines 17 set in a grid pattern on the front surface 13 of the substrate 11 and devices 18 formed in respective regions partitioned by the division lines 17. The peripheral surplus region 16 is a region which surrounds the device region 15 over the whole circumference and which has no device 18 formed therein.

The device 18 constitutes a three dimensional NOT-AND (3D NAND) flash memory and includes an electrode pad and through electrodes connected to the electrode pad. The through electrodes penetrate the back surface 14 of the substrate 11 when the substrate 11 is thinned and the devices 18 are individually divided from the wafer 10. In other words, the wafer 10 according to the embodiment is what is called a TSV wafer in which the individually divided devices 18 have the through electrodes. Note that, in the present invention, the wafer 10 is not limited to the TSV wafer having the through electrodes as in the embodiment and may be a device wafer having no through electrode.

In the bonded wafer forming step 1 according to the embodiment, one surface of the wafer 10 to be bonded is the front surface 13. In the bonded wafer forming step 1, first, as depicted in FIG. 2, an adhesion layer 19 is laminated on either the front surface 13 of the first wafer 10-1 or the front surface 13 of the second wafer 10-2. In the embodiment, the adhesion layer 19 is laminated on the front surface 13 of the second wafer 10-2. Note that, in the embodiment, the adhesion layer 19 is a double-sided adhesive tape having a substrate layer and adhesive layers laminated on face and back surfaces of the substrate layer. In the present invention, however, the adhesion layer 19 is not limited to the double-sided adhesive tape and may be an oxide film or one formed by being coated with an adhesive including resin, for example. In addition, without using the adhesion layer 19, the first wafer 10-1 and the second wafer 10-2 may be directly joined to each other.

In the bonded wafer forming step 1, next, as depicted in FIG. 2, the front surface 13 of the first wafer 10-1 and the adhesion layer 19 laminated on the front surface 13 of the second wafer 10-2 are caused to face each other with a space therebetween. Then, as depicted in FIG. 3, the front surface 13 of the first wafer 10-1 and the front surface 13 of the second wafer 10-2 are bonded together through the adhesion layer 19. As a result, the bonded wafer 20 is formed.

Figure 4:
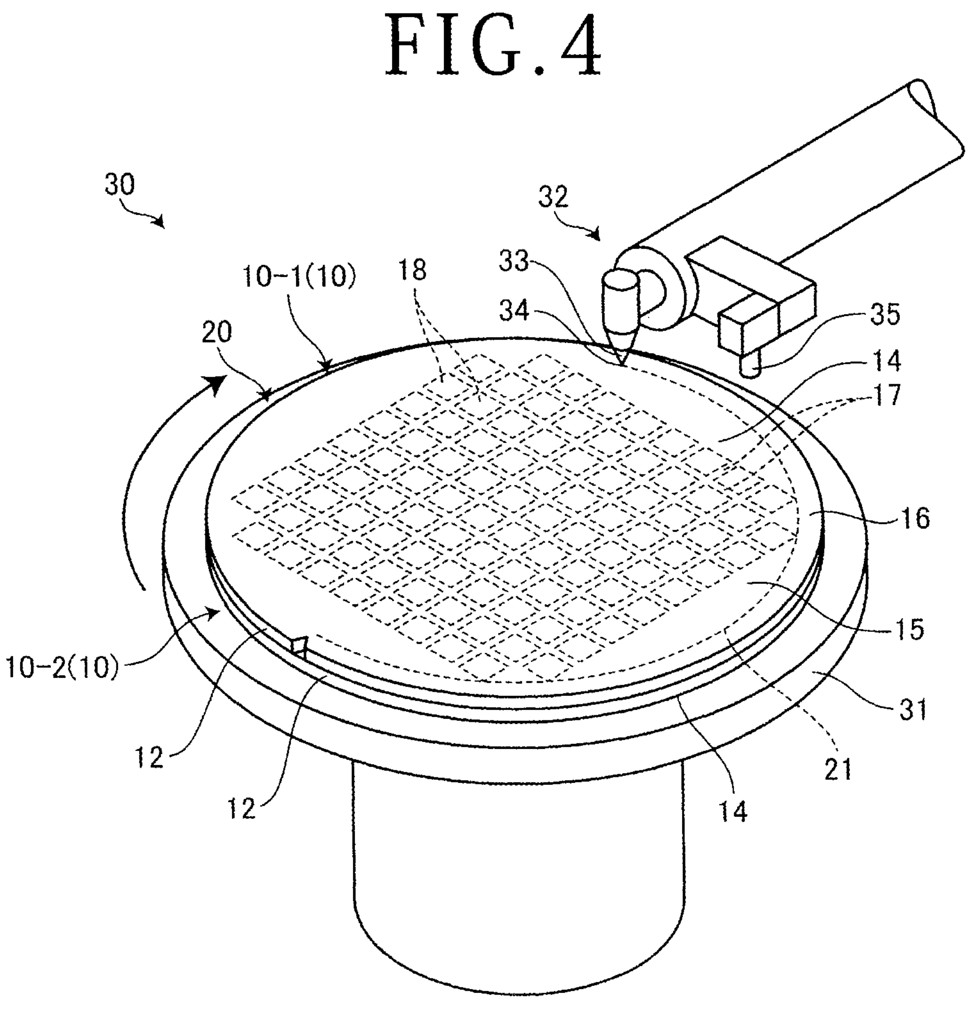
FIG. 4 is a perspective view depicting one state in a modified layer forming step depicted in FIG. 1.
Figure 5:
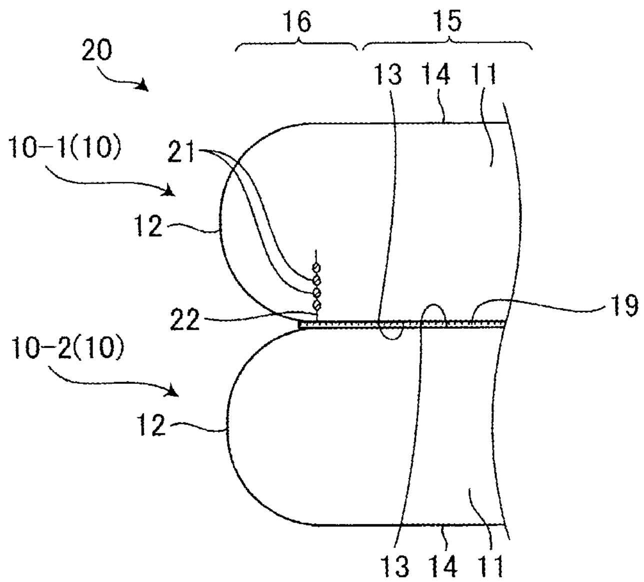
FIG. 5 is a sectional view depicting, in an enlarged form, a part of the bonded wafer that has undergone the modified layer forming step depicted in FIG. 1.

FIG. 4 is a perspective view depicting one state in the modified layer forming step 2 depicted in FIG. 2. FIG. 5 is a sectional view depicting, in an enlarged form, a part of the bonded wafer 20 that has undergone the modified layer forming step 2 depicted in FIG. 1. The modified layer forming step 2 is a step of forming an annular modified layer 21 along the boundary of the device region 15 and the peripheral surplus region 16 of the first wafer 10-1. In the modified layer forming step 2, the modified layer 21 is formed inside the first wafer 10-1 by stealth dicing with the use of a laser processing apparatus 30.

The laser processing apparatus 30 includes a holding table 31 and a laser beam applying unit 32. The holding table 31 holds the wafer 10 on a holding surface thereof and can be rotated around a vertical axis. The laser beam applying unit 32 applies a laser beam 33 to the wafer 10 held by the holding table 31. Further, the laser processing apparatus 30 includes an unillustrated moving unit for moving the holding table 31 and the laser beam applying unit 32 relative to each other, an imaging unit 35 for imaging the wafer 10 held by the holding table 31, and the like.

In the modified layer forming step 2, the laser beam 33 is applied along the boundary of the device region 15 and the peripheral surplus region 16 of the first wafer 10-1, whereby the annular modified layer 21 is formed in the first wafer 10-1. The laser beam 33 is a laser beam having such a wavelength as to be transmitted through the first wafer 10-1 and is, for example, infrared rays (IR).

The modified layer 21 means a region where the density, refractive index, mechanical strength, or any other physical characteristic thereof is made different from that of the surroundings by the laser beam 33 applied thereto. The modified layer 21 is, for example, a melting treatment region, a cracked region, a dielectric breakdown region, a refractive index varied region, or a region where these regions are mixed. The modified layer 21 is lower than the other part of the first wafer 10-1 in mechanical strength or the like.

In the modified layer forming step 2, first, the back surface 14 of the second wafer 10-2 is held under suction on the holding surface (upper surface) of the holding table 31. Next, alignment of the first wafer 10-1 and a light concentrator of the laser beam applying unit 32 is performed. Specifically, the unillustrated moving unit moves the holding table 31 to an application region below the laser beam applying unit 32. Then, the first wafer 10-1 is imaged by the imaging unit 35, and alignment is performed. Thus, an application section of the laser beam applying unit 32 is arranged to vertically face the position of the boundary of the device region 15 and the peripheral surplus region 16 of the first wafer 10-1, after which a focal point 34 of the laser beam 33 is set inside the first wafer 10-1.

In the modified layer forming step 2, next, while the holding table 31 is rotated around the vertical axis, the laser beam applying unit 32 applies the laser beam 33 to the first wafer 10-1 from the back surface 14 thereof. In other words, the laser beam 33 is applied along the boundary of the device region 15 and the peripheral surplus region 16 of the first wafer 10-1, to form the annular modified layer 21. From the modified layer 21, cracks 22 extend. In the modified layer forming step 2, it is preferable to apply the laser beam 33 in such a manner that the cracks 22 extending from the modified layer 21 do not appear on the front surface 13.

Note that, in the modified layer forming step 2, the laser beam 33 may be applied a plurality of times while the height position of the focal point 34 of the laser beam 33 is changed. Alternatively, the laser beam 33 having a plurality of focal points 34 spaced from one another in the thickness direction of the first wafer 10-1 may be applied to form a plurality of the modified layers 21 in the thickness direction of the first wafer 10-1.

Figure 6:
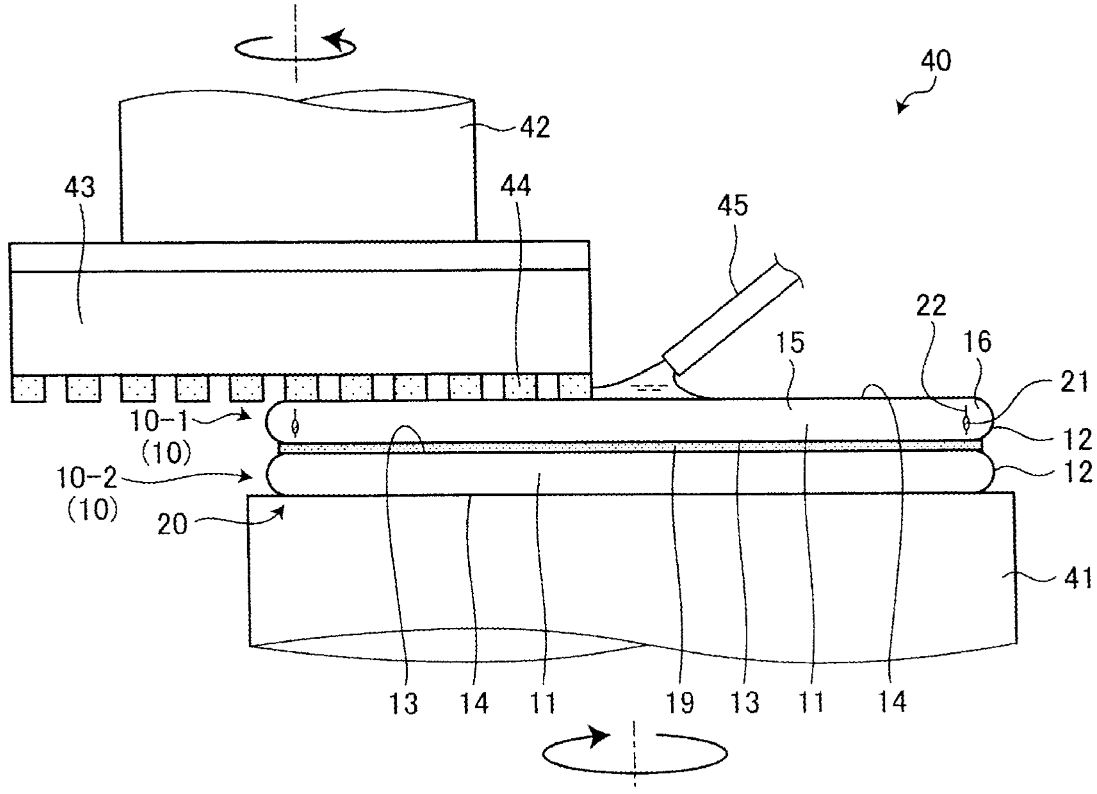
FIG. 6 is a side view depicting, partly in section, a grinding step depicted in FIG. 1.

FIG. 6 is a side view depicting, partly in section, the grinding step 3 depicted in FIG. 1. The grinding step 3 is carried out after the modified layer forming step 2 is performed. The grinding step 3 is a step of grinding the first wafer 10-1 of the bonded wafer 20 from the other surface thereof to thin it to a finished thickness. In the grinding step 3 according to the embodiment, a grinding apparatus 40 grinds the back surface 14 of the first wafer 10-1 to thin it to a predetermined finished thickness.

The grinding apparatus 40 includes a holding table 41, a spindle 42 as a rotary shaft member, a grinding wheel 43 mounted to a lower end of the spindle 42, grindstones 44 mounted to a lower surface of the grinding wheel 43, and a grinding liquid supply unit 45. The grinding wheel 43 is rotated around a rotational axis parallel to the axis of the holding table 41.

In the grinding step 3, first, the back surface 14 of the second wafer 10-2 is held under suction on a holding surface of the holding table 41. Next, in a state in which the holding table 41 is being rotated around the axis, the grinding wheel 43 is rotated around the axis. While a grinding liquid is supplied to a processing point by the grinding liquid supply unit 45, the grindstones 44 of the grinding wheel 43 are brought close to the holding table 41 at a predetermined feed speed, whereby the back surface 14 of the first wafer 10-1 is ground by the grindstones 44 to thin the first wafer 10-1 to a predetermined finished thickness.

In the modified layer forming step 2 according to the embodiment, the laser beam 33 has been applied in such a manner that the cracks 22 extending from the modified layer 21 do not appear on the front surface 13 of the first wafer 10-1. As a result, even if a grinding load is exerted on the first wafer 10-1 in the grinding step 3, the peripheral surplus region 16 can be restrained from being unintentionally separated during grinding.

Figure 7:
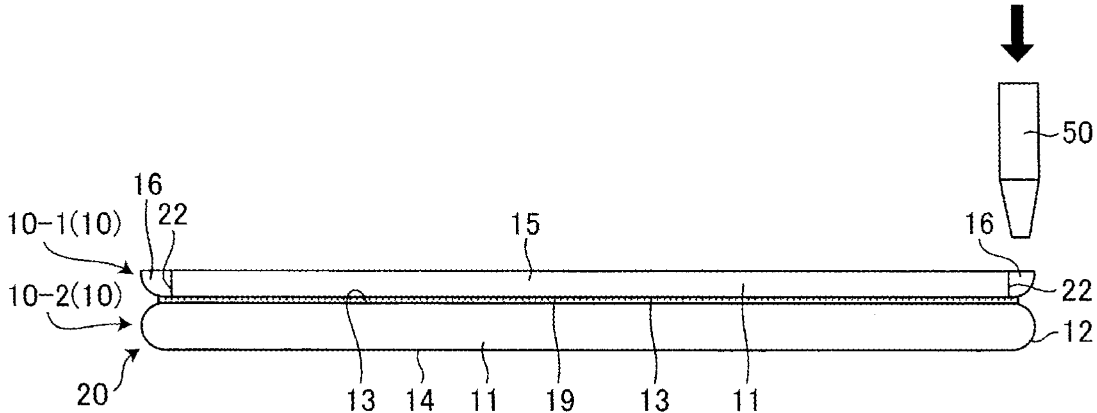
FIG. 7 is a side view depicting, partly in section, one example of an external force exerting step depicted in FIG. 1.

FIG. 7 is a side view depicting, partly in section, one example of the external force exerting step 4 depicted in FIG. 1. The external force exerting step 4 is carried out while the grinding step 3 is performed or after the grinding step 3 is performed. According to the embodiment, the external force exerting step 4 is carried out after the grinding step 3 is performed. The external force exerting step 4 is a step of exerting an external force on the peripheral surplus region 16 that is close to the peripheral edge 12 with respect to the region where the modified layer 21 and the cracks 22 are formed in the modified layer forming step 2, to thereby facilitate the separation of the peripheral surplus region 16. In the external force exerting step 4 according to the embodiment, a shearing force in the thickness direction of the first wafer 10-1 is exerted by a pressing member 50, whereby the peripheral surplus region 16 is removed.

The pressing member 50 can be moved in a direction perpendicular to the one surface (front surface 13) of the first wafer 10-1. In other words, the pressing member 50 can be moved in the vertical direction relative to the bonded wafer 20 held in a horizontal posture, and presses and exerts a load on the first wafer 10-1 of the bonded wafer 20 from above, thereby exerting an external force on the first wafer 10-1. In the external force exerting step 4, the pressing member 50 is lowered in a state of facing the peripheral surplus region 16 of the first wafer 10-1 in the vertical direction and is pressed against the peripheral surplus region 16 of the first wafer 10-1, thereby exerting a load on the peripheral surplus region 16.

As a result, a downward external force is exerted on the peripheral surplus region 16 by the pressing member 50, to facilitate the separation of the peripheral surplus region 16. Then, the device region 15 and the peripheral surplus region 16 are divided from each other with the modified layer 21 and the cracks 22 as starting points, whereby the peripheral surplus region 16 of the first wafer 10-1 is removed.

As has been described above, in the method of processing the wafer 10 according to the embodiment, the external force is exerted on the first wafer 10-1 of the bonded wafer 20 during grinding or after grinding, whereby the peripheral surplus region 16 is removed. Hence, an end part of the peripheral surplus region 16 can securely be removed while the devices 18 are restrained from being broken or damaged. In addition, since the end part can be crushed to pieces by the exertion of the external force, the peripheral surplus region 16 can be restrained from being separated in an annular shape or circular arc shape during grinding and being scattered into a processing room of the grinding apparatus 40. As a result, the respective component parts of the grinding apparatus 40, such as the grindstones 44, can be restrained from being damaged.

Note that the present invention is not limited to the above-described embodiment. In other words, the present invention can be carried out with various modifications within such ranges as not to depart from the gist of the present invention. For example, the modified layer forming step 2 may be carried out before the bonded wafer forming step 1, and it is sufficient that the bonded wafer 20 and the modified layer 21 are formed at least before the grinding step 3 is carried out.

In addition, in the modified layer forming step 2, there may also be formed an auxiliary modified layer that partitions the peripheral surplus region 16, which is a region close to the peripheral edge 12 with respect to the annular modified layer 21 of the first wafer 10-1, into at least two parts. The auxiliary modified layer may be formed, for example, in a radial direction at a predetermined position in the circumferential direction in the peripheral surplus region 16 of the first wafer 10-1 or may be formed in an annular shape concentric with the modified layer 21. For such an auxiliary modified layer, the number of divisions may be set as required according to the diameter of the first wafer 10-1 or the width of the peripheral surplus region 16.

In addition, in the modified layer forming step 2 according to the embodiment, the modified layer 21 has been formed in such a manner that the cracks 22 extend in the thickness direction of the first wafer 10-1. However, a modified layer 21-1 and cracks 22-1 may be formed according to a first modification depicted in FIG. 8, or a modified layer 21-2 and cracks 22-2 may also be formed according to a second modification depicted in FIG. 9.

Besides, the method of exerting an external force in the external force exerting step 4 is not limited to the method of exerting an external force in a shearing direction by pressing the peripheral surplus region 16 from above, and may be, for example, a method of rolling a roller to crush the peripheral surplus region 16. In addition, the external force exerting step 4 is carried out after the grinding step 3 is performed in the embodiment. However, the external force exerting step 4 may also be carried out while the grinding step 3 is performed, as in a third modification depicted in FIG. 10 or in a fourth modification depicted in FIG. 11.

First Modification

Figure 8:
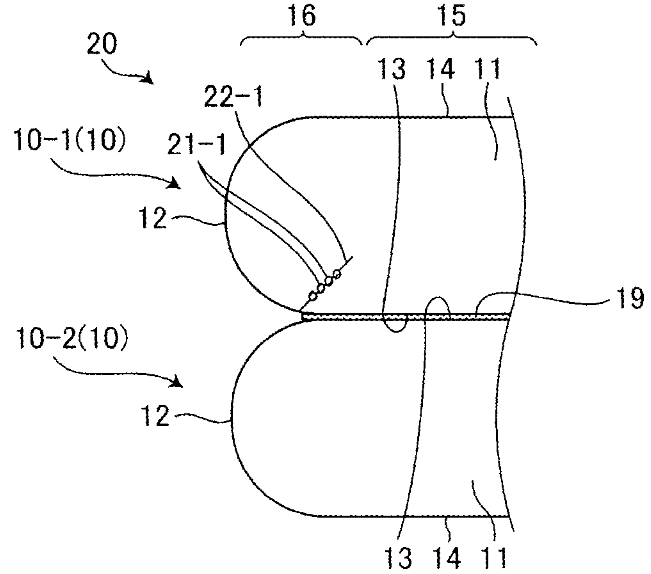
FIG. 8 is a sectional view depicting, in an enlarged form, a part of a bonded wafer that has undergone a modified layer forming step according to a first modification.

FIG. 8 is a sectional view depicting, in an enlarged form, a part of a bonded wafer 20 that has undergone a modified layer forming step 2 according to the first modification. In the modified layer forming step 2 according to the first modification, at a position on the inside of and at a predetermined distance from the peripheral edge 12 of the first wafer 10-1, the modified layer 21-1 in a shape extending along a side surface of a truncated cone and the cracks 22-1 are formed.

In the modified layer forming step 2 according to the first modification, the laser beam 33 is applied to a region on the inside of and at a predetermined distance from the peripheral edge 12 of the first wafer 10-1, in such a manner that the focal point 34 of the laser beam 33 is sequentially placed at a position closer to the one surface of the first wafer 10-1 toward the peripheral edge 12, to thereby form the modified layer 21-1 in a shape extending along a side surface of a truncated cone inclined from the one surface toward the other surface of the first wafer 10-1. In the first modification, the one surface is the front surface 13, and the other surface is the back surface 14.

In the modified layer forming step 2 according to the first modification, as in the embodiment, alignment of the first wafer 10-1 and the light concentrator of the laser beam applying unit 32 is first performed. In the first modification, the application section of the laser beam applying unit 32 is arranged to vertically face a position on the inside of and at a predetermined distance from the peripheral edge 12 of the first wafer 10-1, after which the focal point 34 of the laser beam 33 is set inside the first wafer 10-1.

In the modified layer forming step 2 according to the first modification, next, while the holding table 31 is rotated around a vertical axis, the laser beam applying unit 32 applies the laser beam 33 to the first wafer 10-1 from the back surface 14 thereof. In other words, the laser beam 33 is applied along the positions on the inside of and at a predetermined distance from the peripheral edge 12 of the first wafer 10-1, to form the annular modified layer 21-1.

In the modified layer forming step 2 according to the first modification, the laser beam 33 is applied a plurality of times while the position of the focal point 34 of the laser beam 33 is changed in such a manner that the focal point 34 is sequentially placed at a position closer to the one surface of the first wafer 10-1 toward the peripheral edge 12. Alternatively, the laser beam 33 having a plurality of focal points 34 is applied. As a result, a plurality of modified layers 21-1 are formed along a side surface of a truncated cone inclined from the front surface 13 toward the back surface 14 of the first wafer 10-1. When the cracks 22-1 extend from and are connected to the modified layers 21-1, starting points of division are formed along a side surface of a truncated cone inclined from the front surface 13 toward the back surface 14.

As a result, on the adhesion layer 19 (the front surface 13) through which the wafers 10 are bonded together, the cracks 22-1 extend to the peripheral edge 12 with respect to the adhesion layer 19, and hence, in the later external force exerting step 4, the end part of the peripheral surplus region 16 can be restrained from remaining on the first wafer while being joined to the second wafer 10-2 through the adhesion layer 19.

Second Modification

Figure 9:
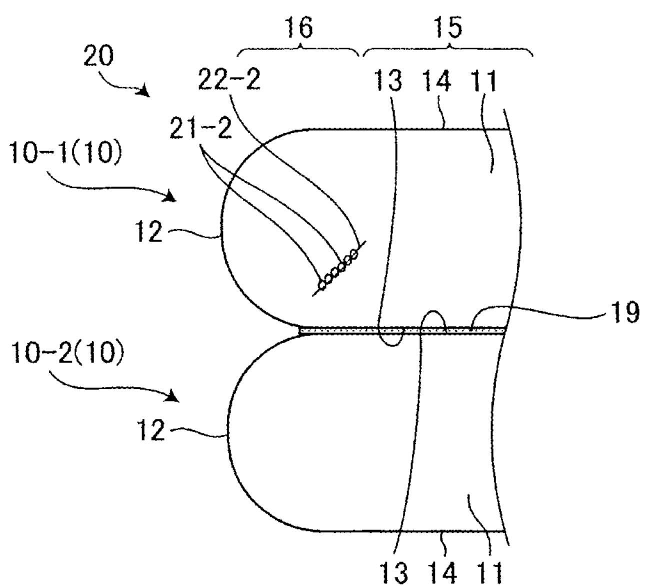
FIG. 9 is a sectional view depicting, in an enlarged form, a part of a bonded wafer that has undergone a modified layer forming step according a second modification.

FIG. 9 is a sectional view depicting, in an enlarged form, a part of a bonded wafer 20 that has undergone a modified layer forming step 2 according to a second modification. In the modified layer forming step 2 according to the second modification, at a position on the inside of and at a predetermined distance from the peripheral edge 12 of the first wafer 10-1, the modified layer 21-2 in a shape extending along a side surface of a truncated cone and the cracks 22-2 are formed.

The modified layer 21-2 and the cracks 22-2 are formed according to a procedure substantially similar to the procedure of forming the modified layer 21-1 and the cracks 22-1 in the first modification. It is to be noted that, in the modified layer forming step 2 according to the second modification, the laser beam 33 is applied in such a manner that the cracks 22-2 extending from the modified layer 21-2 do not appear on the front surface 13 of the first wafer 10-1.

As a result, the peripheral surplus region 16 can be restrained from being separated due to the grinding load in the later grinding step 3 but can be separated in the external force exerting step 4. Hence, it is possible to restrain the grindstones 44 and the like of the grinding apparatus 40 from being damaged due to the separation and/or scattering of the peripheral surplus region 16 during grinding.

Third Modification

Figure 10:
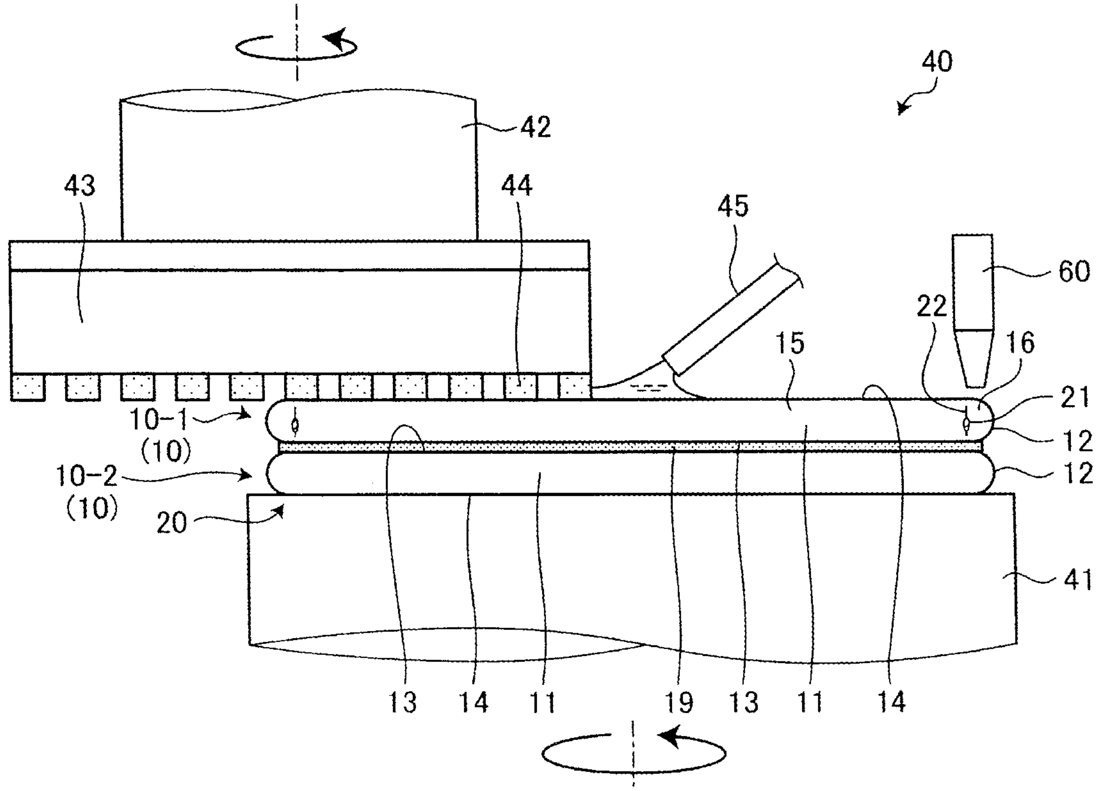
FIG. 10 is a side view depicting, partly in section, one example of a grinding step and an external force exerting step according to a third modification.

FIG. 10 is a side view depicting, partly in section, one example of a grinding step 3 and an external force exerting step 4 according to a third modification. In the third modification, while the grinding step 3 is performed by the grinding apparatus 40, the external force exerting step 4 is carried out by an ultrasonic wave applying unit 60. The grinding step 3 according to the third modification is similar to the grinding step 3 according to the embodiment, and therefore, description thereof is omitted.

In the external force exerting step 4 according to the third modification, an ultrasonic wave is applied to the peripheral surplus region 16 of the first wafer 10-1 by the ultrasonic wave applying unit 60, and an external force is exerted by vibrations generated by the ultrasonic wave, to thereby remove the peripheral surplus region 16.

The ultrasonic wave applying unit 60 includes, for example, an ultrasonic vibrator which is contracted and expanded by application of alternating current (AC) power to generate ultrasonic vibrations on a ground surface of the first wafer 10-1, a power source for applying the AC power to the ultrasonic vibrator, and a liquid supply unit. In the external force exerting step 4 according to the third modification, while the grinding step 3 is performed, first, liquid is supplied to an area between the ultrasonic vibrator and the ground surface from the liquid supply unit in a state in which the ultrasonic vibrator is arranged to vertically face the peripheral surplus region 16 of the first wafer 10-1. The liquid is, for example, pure water.

In the external force exerting step 4 according to the third modification, next, while a surface of the ultrasonic vibrator of the ultrasonic wave applying unit 60 facing the peripheral surplus region 16 is immersed in the liquid, the AC power is applied to the ultrasonic vibrator for a predetermined period of time to cause ultrasonic vibrations on the surface of the ultrasonic vibrator. When the ultrasonic vibrations are thereby applied to the peripheral surplus region 16 through the liquid, the cracks 22 extend from the modified layer 21, the device region 15 and the peripheral surplus region 16 are divided from each other with the modified layer 21 and the cracks 22 as starting points, and the peripheral surplus region 16 of the first wafer 10-1 is removed.

Fourth Modification

Figure 11:
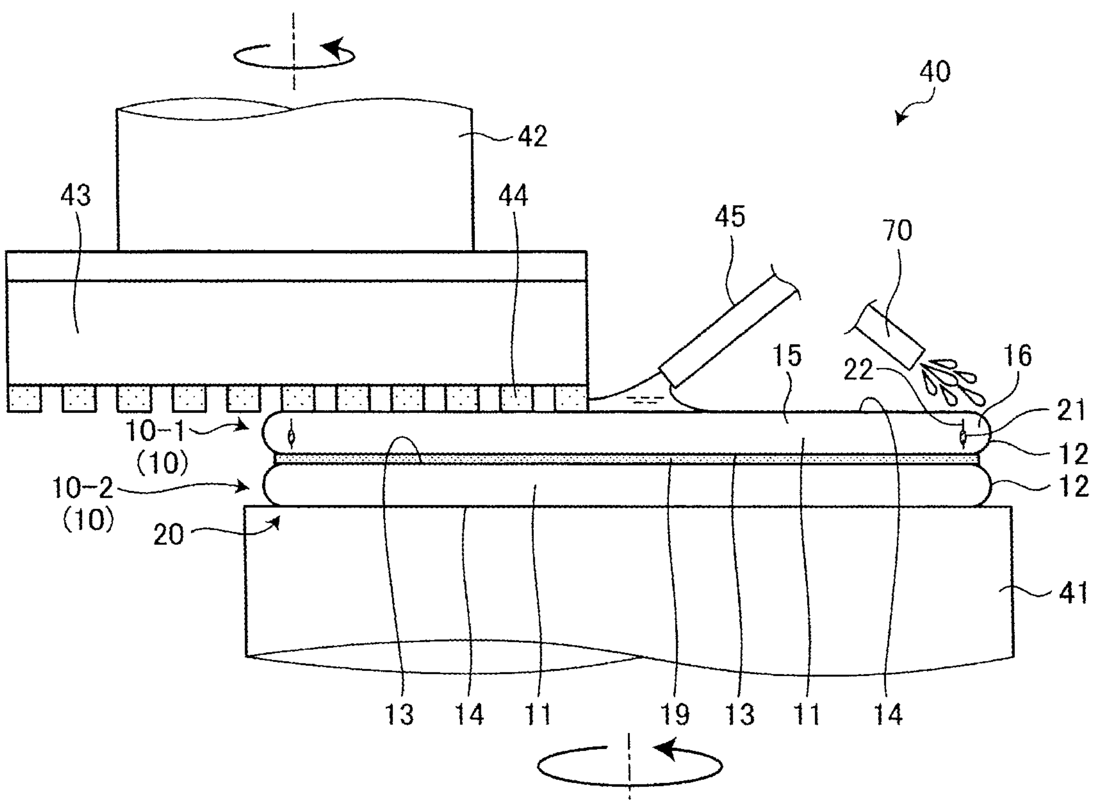
FIG. 11 is a side view depicting, partly in section, one example of a grinding step and an external force exerting step according to a fourth modification.

FIG. 11 is a side view depicting, partly in section, one example of a grinding step 3 and an external force exerting step 4 according to a fourth modification. In the fourth modification, while the grinding step 3 is performed by the grinding apparatus 40, the external force exerting step 4 is carried out by a jetting unit 70. The grinding step 3 according to the fourth modification is similar to the grinding step 3 according to the embodiment, and therefore, description thereof is omitted.

In the external force exerting step 4 according to the fourth modification, liquid, a solid, or a combination of liquid and a solid is blown to the peripheral surplus region 16 of the first wafer 10-1 by the jetting unit 70 to exert a force of collision of at least either the liquid or the solid on the peripheral surplus region 16, thereby removing the peripheral surplus region 16.

The jetting unit 70 has a nozzle connected to a supply source from which the liquid and/or the solid is supplied, and the liquid, the solid, or the combination of the liquid and the solid is jetted out from the tip of the nozzle. The liquid jetted out from the jetting unit 70 is, for example, pressurized water. The solid jetted out from the jetting unit 70 is, for example, dry ice. In the external force exerting step 4 according to the fourth modification, while the grinding step 3 is performed, the nozzle of the jetting unit 70 is arranged to face the peripheral surplus region 16 and blows the liquid and/or the solid to the peripheral surplus region 16. When a force of collision of the liquid and/or the solid is thus exerted on the peripheral surplus region 16, the cracks 22 extend from the modified layer 21, the device region 15 and the peripheral surplus region 16 are divided from each other with the modified layer 21 and the cracks 22 as the starting points, and the peripheral surplus region 16 of the first wafer 10-1 is removed.

By carrying out the external force exerting step 4 while the grinding step 3 is performed as in the third modification and the fourth modification, it is possible to exert an external force on the peripheral surplus region 16 before the grinding proceeds and to crush the end part to pieces, and hence, it is possible to restrain the peripheral surplus region 16 from being separated in an annular shape or circular arc shape during the grinding and being scattered into the processing room of the grinding apparatus 40. In addition, while the first wafer 10-1 is ground, the external force is exerted thereon. Accordingly, the peripheral surplus region 16 is separated when the grinding is finished, so that the time required to process the wafer 10 can be shortened.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method comprising:

a bonded wafer forming step of forming a bonded wafer by bonding one surface of a first wafer to one surface of a second wafer, the first wafer having a device region in which a plurality of devices are formed on the one surface, a peripheral surplus region surrounding the device region, and a chamfered peripheral edge;

a modified layer forming step of forming an annular modified layer along a boundary of the device region and the peripheral surplus region of the first wafer by applying a laser beam having such a wavelength as to be transmitted through the first wafer to the one surface of the first wafer from another surface of the first wafer that is opposite to the one surface thereof, with a focal point of the laser beam placed at the boundary;

a grinding step of, after the modified layer forming step, grinding the first wafer of the bonded wafer from the other surface of the first wafer to thin the first wafer to a finished thickness; and an external force exerting step of, during or after the grinding step, exerting an external force on the peripheral surplus region that is close to the peripheral edge with respect to a region in which the modified layer is formed in the modified layer forming step, to thereby facilitate separation of the peripheral surplus region.

2. The wafer processing method according to claim 1, wherein, in the modified layer forming step, the laser beam is applied to the first wafer in such a manner that the focal point of the laser beam is sequentially placed at a position closer to the one surface of the first wafer toward the peripheral edge, to thereby form the modified layer in a shape extending along a side surface of a truncated cone inclined from the one surface toward the other surface of the first wafer.

3. The wafer processing method according to claim 1, wherein, in the modified layer forming step, the laser beam is applied to the first wafer in such a manner that cracks extending from the modified layer do not appear on the one surface side of the first wafer, to thereby restrain the peripheral surplus region from being separated from the first wafer while the grinding step is carried out, but separate the peripheral surplus region from the first wafer in the external force exerting step.

4. The wafer processing method according to claim 1, wherein, in the external force exerting step, an ultrasonic wave is applied to the peripheral surplus region to thereby facilitate the separation of the peripheral surplus region.

5. The wafer processing method according to claim 1, wherein, in the external force exerting step, at least one of fluid or a solid is blown to the peripheral surplus region to thereby facilitate the separation of the peripheral surplus region.

6. The wafer processing method according to claim 1, wherein, in the external force exerting step, a pressing member capable of moving in a direction perpendicular to the one surface of the first wafer exerts a load on the peripheral surplus region to thereby facilitate the separation of the peripheral surplus region.

* * * * *